United States Patent
Hiraga (10) Patent No.: US 6,661,101 B2
(45) Date of Patent: Dec. 9, 2003

(54) SEMICONDUCTOR DEVICE (75) Inventor: Noriaki Hiraga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/366,347

(22) Filed: Feb. 14, 2003

(65) Prior Publication Data

US 2003/0151113 A1 Aug. 14, 2003

(30) Foreign Application Priority Data

Feb. 14, 2002 (JP) ........................................ 2002-036466

(51) Int. Cl.$^7$ ............................................... H01L 23/48
(52) U.S. Cl. ....................... 257/786; 257/773; 257/775; 257/691; 257/692; 257/701
(58) Field of Search ................................. 257/786, 773, 257/775, 690, 691, 692, 701

(56) References Cited

U.S. PATENT DOCUMENTS

2001/0011768 A1 * 8/2001 Kohara et al. .............. 257/786

* cited by examiner

*Primary Examiner*—Mark V. Prenty
(74) *Attorney, Agent, or Firm*—Sughrue Mion, PLLC (57) ABSTRACT There is provided a semiconductor device capable of properly processing RF signals even though the number of electrodes as well as terminals for external connection is large while pitches at which the electrodes are juxtaposed are narrower than those for the terminals for external connection. A reference electrode connected with a reference voltage line of integrated circuits is increased in number to plurality, and each of the reference electrodes is disposed on top of the semiconductor piece, and on opposite sides of the respective signal electrodes connected with the signal lines of the integral circuits while short circuited at a conductor layer. Further, a conductor layer is extended from the respective reference electrodes or the conductor layer towards both sides of the respective signal electrodes.

12 Claims, 7 Drawing Sheets

SEMICONDUCTOR DEVICE

FIELD OF THE INVENTION

The invention relates to a multi-pin (terminal for external connection) semiconductor device with an integrated circuit mounted therein, for processing several signals including RF signals, and more specifically, to a semiconductor device wherein pads (electrodes) provided on a semiconductor chip (semiconductor piece) are connected with terminals (terminals for external connection) on the side of a package so as to correspond to each other, respectively, by a bonding wire (thin metal wire), respectively.

BACKGROUND OF THE INVENTION

With a semiconductor device for processing RF signals, by, for example, directly connecting ground leads juxtaposed with signal leads to the back surface of a semiconductor chip, and further, by providing even a metal sheet in parallel with ground electrodes, grounding impedance at a resonance frequency is rendered zero in order to reduce undesirable reflection at input/output terminals (JP, H8-237001, A). Since such a semiconductor device for RF is generally not highly integrated, and is provided as a single-function item/a special-purpose item, for processing a single or a few signals, pads (electrodes) on the semiconductor chip and terminals for external connection on the side of a package are only a few in number.

On the other hand, with a semiconductor device that does not handle signals at so much high frequencies, but exchanges a large number of signals with the outside, advances have since been made towards multiplication of pins along with higher integration, so that the number of bonding pads as well as bonding wires has increased.

Figure 7A:
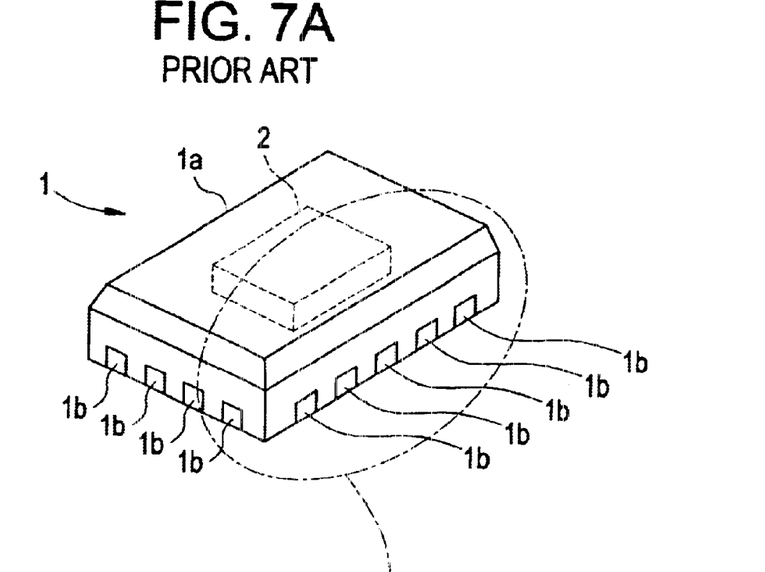
Figure 7B:
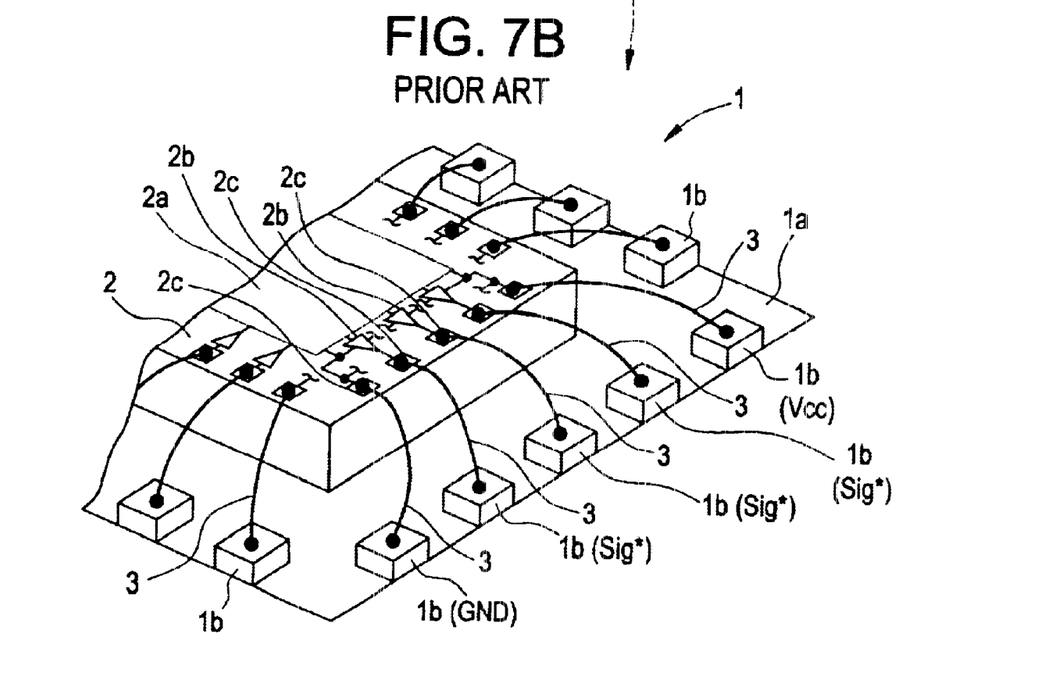

Shown in FIG. 7 as an example of such a semiconductor device is an IC1, which is obtained by packaging a semiconductor chip (semiconductor piece) 2 with a plastic mold 1a, and a multitude of terminals (terminals for external connection) 1b are also assembled therein in such a way as to be partially exposed. On the central part of the main top surface of the chip 2, there is formed a signal processing circuit (integrated circuit) 2a, on the periphery of which there are formed signal input circuits and signal output circuits (integrated circuits) 2b. On the outermost peripheral parts (peripheral edge parts) of the signal processing circuit 2a, there are formed bonding pads (electrodes) 2c so as to be juxtaposed at predetermined pitches.

Any one (power source electrode) among a multitude of the bonding pads 2c is connected with power source lines of the signal processing circuit 2a, the signal output circuits 2b, etc. via a patterned wiring layer etc., formed in the chip 2, respectively, and at the same time, is connected with a terminal 1b (Vcc) for power source voltage application via a relevant bonding wire 3. Further, another bonding pad (reference electrode) 2c is connected with reference voltage lines of the signal processing circuit 2a, the signal output circuits 2b, etc. via a patterned wiring layer etc., formed in the chip 2, respectively, and at the same time, is connected with a grounding terminal 1b (GND) via another relevant bonding wire 3. Remaining bonding pads (signal electrodes) 2c are connected with relevant signal lines of the signal processing circuit 2a, respectively, either indirectly through the intermediary of relevant signal output circuits 2b or directly, and at the same time, are connected with relevant signal terminals 1b (Sig), respectively.

With the multi-pin IC1, the number of the bonding pads 2c formed on the chip 2 is large and in addition, the chip 2 of high circuit integration is so small as to be encapsulated in the plastic mold 1a while the terminals 1b which are substantially the same in number as the bonding pads 2c are disposed in the surface location of the plastic mold 1a, and in addition, are lined up so as to fit an external mounting condition, so that the pitches at which the bonding pads 2c are juxtaposed are narrower than those for the terminals 1b, and consequently, the bonding wires 3 are provided radially.

Now, with a fast digital signal processing circuit used in an LDVS (Laser Video Disc System) etc., an RF signal processing circuit used in a wireless LAN (local Area Network) etc., and so forth, the above-described ICs of different types are used selectively or in combination.

In the years ahead of the present situation where advances are being made concurrently towards higher-function, higher-speed, and miniaturization, future demands can be foreseen such that the number of semiconductor chips should be held down while the total number of signals to be processed and the number of RF signals contained in the signals are to be increased.

With the conventional semiconductor device described above, however, all the circuits cannot be formed simply in one chip because of difference in conditions for improving frequency characteristics, conditions concerning bonding spots, and so forth.

Accordingly, in forming an integrated circuit for processing a large number of signals including RF signals in one chip, there is encountered a technical problem to devise some effective means for preventing deterioration of RF signals, in particular, the frequency characteristic thereof, while meeting conditions for connecting bonding pads (electrodes) with pins (terminals for external connection), associated with a multi-pin IC, and other conditions.

SUMMARY OF THE INVENTION

The Invention has been developed to resolve the problem described, and it is an object of the invention to provide a semiconductor device capable of properly processing RF signals even though the number of electrodes as well as terminals for external connection is large, and pitches at which the electrodes are juxtaposed are narrower than the pitches at which the terminals for external connection are juxtaposed.

With reference to first to fifth problem-solving means according to the invention developed to resolve the problem described above, configurations and operation effects thereof are described hereinafter.

First Problem-solving Means

A semiconductor device according to a first problem-solving means is a semiconductor device comprising a semiconductor piece with an integrated circuit for processing signals, formed therein, signal electrodes connected with signal lines of the integrated circuit formed in the semiconductor piece, respectively, a reference electrode connected with a reference voltage line of the integrated circuit formed in the semiconductor piece, a package encapsulating the semiconductor piece, terminals for external connection, juxtaposed on the package at pitches wider than a distance between the respective signal electrodes and the reference electrode adjacent thereto, and a plurality of thin metal wires provided within the package, any thereof connecting any of the terminals for external connection to the respective signal electrodes while any other thereof connecting any other of the terminals for external connection to the reference electrode, wherein the reference electrode is increased in number to plurality, and each of the reference electrodes is disposed on top of the semiconductor piece, and on opposite sides of the respective signal electrodes while short-circuiting means, such as a conductor layer, so forth, for short-circuiting the reference electrodes with each other. on top of the semiconductor piece are provided on the semiconductor piece.

With the semiconductor device according to the first problem-solving means, the reference electrodes short-circuited with each other, and the thin metal wire as well as the terminal for external connection that are connected thereto, are disposed on opposite sides of the signal electrode to which RF signals are transmitted, and the thin metal wire as well as the terminal for external connection that are connected thereto, so that a transmission path for RF signals can be disposed definitely away from a transmission path for other signals, and in addition, current paths for not only direct transmission current for RF signals but also return current in the reverse direction become definite. As a result, noises of either a normal mode or a common mode can be held in check.

Notwithstanding the above, since the characteristic of a multi-pin IC such that the pitches at which the electrodes are juxtaposed are narrower than the pitches at which the terminals for external connection are juxtaposed, a multitude of the electrodes and the terminals for external connection can be ensured even if the semiconductor piece and the package remain small in size, so that a multitude of other signals can be inputted and outputted in parallel and independently. It follows therefore that a multi-function integrated circuit for handling a multitude of signals and a circuit for handling RF signals can be mounted on one chip without impairing the function and performance of either of the circuits.

Accordingly, the invention can provide a semiconductor device capable of properly processing RF signals with the pitches at which the electrodes are juxtaposed remaining narrower than the pitches at which the terminals for external connection are juxtaposed.

Second Problem-solving Means

A semiconductor device according to a second problem-solving means is a semiconductor device that is the same as the semiconductor device according to the first problem-solving means except that the position of the respective signal electrodes is deviated from the alignment of the reference electrodes. That is, assuming a straight line interconnecting the reference electrodes positioned on respective sides of the respective signal electrodes, the respective signal electrodes are provided at a spot deviated from the phantom straight line.

With the semiconductor device according to the second problem-solving means, either one or both of the signal electrode and the reference electrode in a location where RF signals are transmitted are deviated off an alignment of a multitude of the electrodes including electrodes other than those, within a range where wire bonding can be effected. Consequently, the alignment of the electrodes is somewhat in disarray in the location, however, ignoring such disarray, the fundamental pitches in the direction of the alignment are maintained substantially at the same interval as before on the whole, and yet a distance between the electrodes in the location becomes wider than the respective fundamental pitches in the direction of the alignment.

As a result, there occurs easing of a sudden change in capacitance distributed between the thin metal wires forming a pair, that is, parasitic capacitance distributed between the thin metal wire from the signal electrode to the terminal for external connection, and the thin metal wire from the reference electrode to the terminal for external connection, so that impedance matching can be obtained more properly. Consequently, even if the thin metal wires are in radial shape, resultant undesirable effects on RF signals can be checked.

Accordingly, the invention can provide a semiconductor device capable of more properly processing RF signals with the pitches at which the electrodes are juxtaposed remaining narrower than the pitches at which the terminals for external connection are juxtaposed.

Third Problem-solving Means

A semiconductor device according to a third problem-solving means is a semiconductor device that is the same as the semiconductor device according to the second problem-solving means except that a conductor layer is extended from the respective reference electrodes or spots where the respective reference electrodes are short-circuited with each other towards both sides of the respective signal electrodes.

With the semiconductor device according to the third problem-solving means, even though the reference electrodes are deviated from the respective signal electrodes, portions of the conductor layer, extended from the reference electrodes, come back to both sides of the relevant signal electrode, so that the relevant signal electrode still remain interposed between extensions of the reference electrodes.

Consequently, even though the respective signal electrodes are deviated from an alignment of the reference electrodes, an electrically separated state of the relevant signal electrode from other signal electrodes is maintained with certainty by the relevant reference electrodes, and the extensions thereof. Furthermore, the extensions, namely, the conductor layer can be easily formed by utilizing a patterned wiring layer, and so forth.

Accordingly, the invention can provide a semiconductor. device capable of more properly processing RF signals with the pitches at which the electrodes are juxtaposed remaining narrower than the pitches at which the terminals for external connection are juxtaposed.

Fourth Problem-solving Means

A semiconductor device according to a fourth problem-solving means is a semiconductor device that is the same as the semiconductor device according to any one of the first to third problem-solving means except that a tapered conductor is provided so as to be disposed away from the semiconductor piece, and the extremity of the tapered conductor is positioned closer to the thin metal wire connected with the signal electrode, among the thin metal wires, while the base edge of the tapered conductor is positioned farther from the thin metal wire than the extremity of the tapered conductor, being indirectly connected with the reference electrode.

With the semiconductor device according to the fourth problem-solving means, the extremity of the tapered conductor at the same potential as that of the reference electrode, is positioned in the vicinity of the signal electrode and the thin metal wire connected thereto in the location where RF signals are transmitted.

Parasitic capacitance distributed between the tapered conductor and a thin metal wire from the signal electrode to the terminal for external connection is canceled out by parasitic capacitance distributed between the thin metal wire, and a thin metal wire from the reference electrode to the terminal for external connection, so that a sudden change in impedance distribution can be eased.

Consequently, even if the thin metal wires are in radial shape, resultant undesirable effects on RF signals can be checked.

Accordingly, the invention can provide a semiconductor device capable of more properly processing RF signals with the pitches at which the electrodes are juxtaposed remaining narrower than the pitches at which the terminals for external connection are juxtaposed.

Fifth Problem-solving Means

A semiconductor device according to a fifth problem-solving means is a semiconductor device that is the same as the semiconductor device according to any one of the first to fourth problem-solving means except that dielectric constant of a packaging material filling up between the signal electrodes and the terminals for external connection, connected thereto by the thin metal wire, respectively, is variable continuously or in stages along the direction of the thin metal wire, that is, between the respective signal electrodes and the respective terminals for external connection.

With the semiconductor device according to the fifth problem-solving means, in a location where a distance is narrow between the thin metal wire from the respective signal electrodes to the respective terminals for external connection, and the thin metal wire from the respective reference electrodes to the respective terminals for external connection, the dielectric constant of the packaging material is rendered smaller while in a location where the distance between those thin metal wires is wide, the dielectric constant of the packaging material is rendered larger.

Consequently, variation in distribution of parasitic capacitance distributed between the thin metal wires is rendered milder in comparison with variation in distance between the thin metal wires.

Accordingly, the invention can provide a semiconductor device capable of more properly processing RF signals with the pitches at which the electrodes are juxtaposed remaining narrower than the pitches at which the terminals for external connection are juxtaposed.

BRIEF DESCRIPTION OF THE DRAWINGS

FIG. 1 (A) is a partial perspective view of a first embodiment of a semiconductor device according to the invention, as seen through a package, and FIG. 1 (B) a partially enlarged view of a principal part of the semiconductor device according to the first embodiment;

FIG. 2 (A) is a perspective view showing a whole external view of a second embodiment of a semiconductor device according to the invention, FIG. 2 (B) a partially enlarged view of a principal part of the semiconductor device according to the second embodiment, FIG. 2 (C) a longitudinal sectional view of a location around a signal electrode, and FIG. 2 (D) a longitudinal sectional view of a location around a reference electrode;

FIG. 3 (A) is a perspective view showing a whole external view of a third embodiment of a semiconductor device according to the invention, before forming a conductor layer on the external surface thereof, and FIG. 3 (B) a perspective view showing a whole external view of the semiconductor device according to the third embodiment, after forming the conductor layer on the external surface thereof;

FIG. 4 (A) is a plan view showing a lead frame of a fourth embodiment of a semiconductor device according to the invention, and FIG. 4 (B) a perspective view showing an external view of the semiconductor device according to the fourth embodiment, with the lead frame mounted thereon;

FIG. 5 (A) is a longitudinal sectional view of a fifth embodiment of a semiconductor device according to the invention, FIG. 5 (B) a partially enlarged view of a principal part of the semiconductor device according to the fifth embodiment, FIG. 5 (C) a perspective view showing a whole external view thereof before a permeable substance is applied, FIG. 5 (D) a perspective view showing a whole external view thereof after be the permeable substance is applied, and FIG. 5 (E) perspective view showing a whole external view thereof after the permeable substance is permeate d and diffused;

FIGS. 6 (A) is a longitudinal sectional view of a sixth embodiment of a semiconductor device according to the invention, showing an implant agent being implanted, FIG. 6 (B) a longitudinal sectional view of the semiconductor device according to the sixth embodiment after molding, and FIG. 6 (C) a longitudinal sectional view of the semiconductor device according to the sixth embodiment after the implant agent is diffused; and FIG. 7 (A) is a perspective view showing a whole external view of a conventional semiconductor device, and FIG. 7 (B) a partially enlarged view of the conventional semiconductor device, as seen through a package.

PREFERRED EMBODIMENT OF THE INVENTION

Figure 1A:
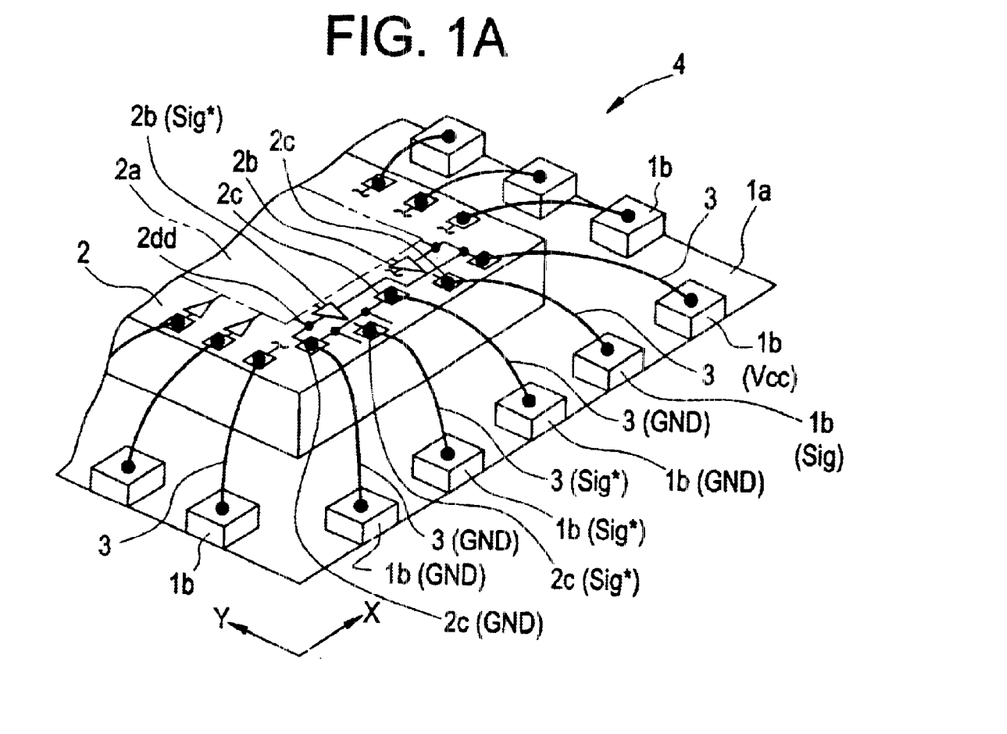
Figure 1B:
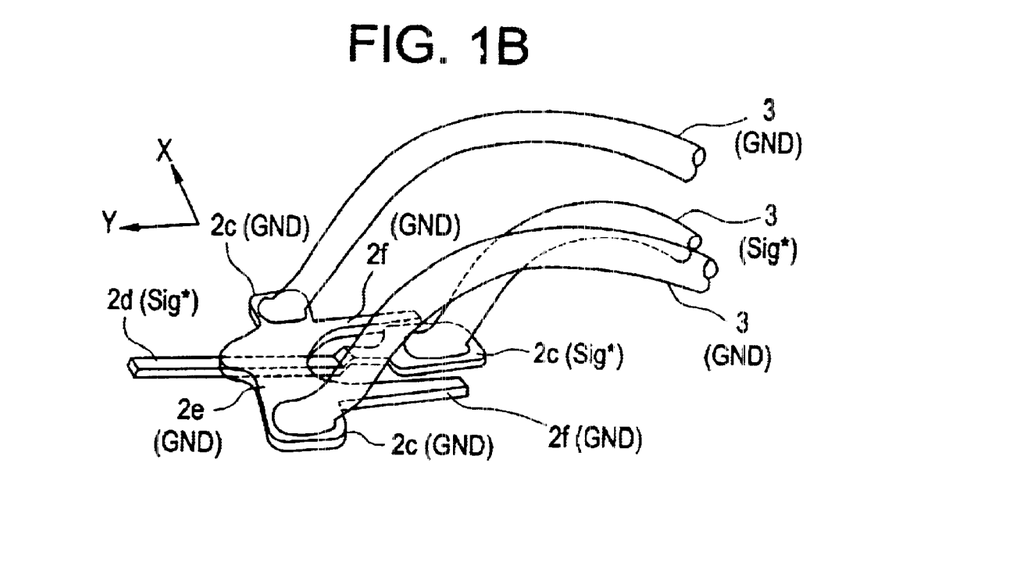
Figure 2A:
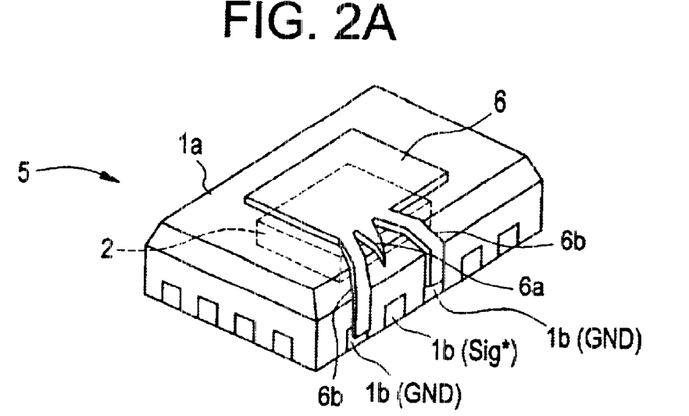
Figure 2B:
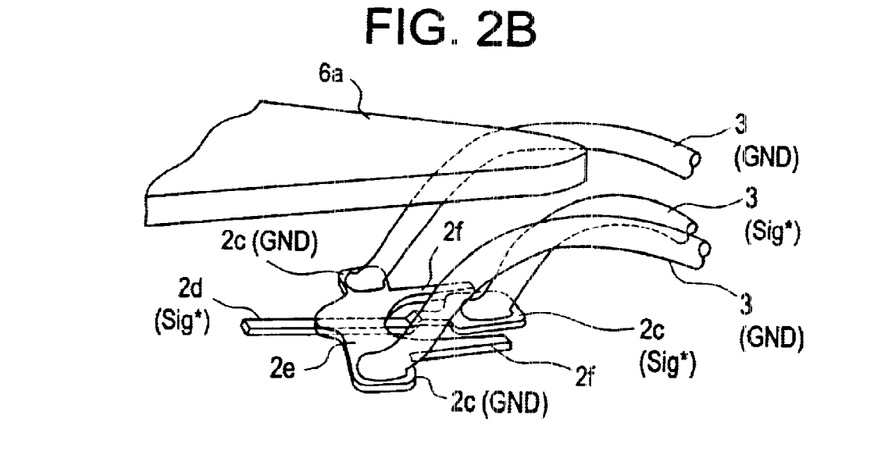
Figure 2C:
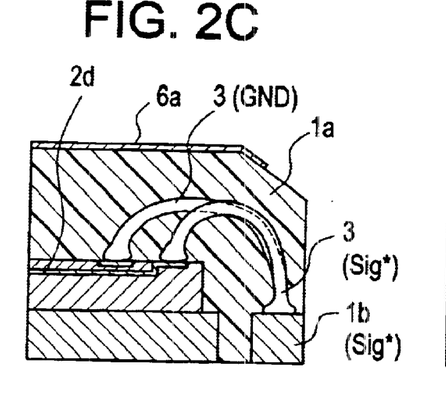
Figure 2D:
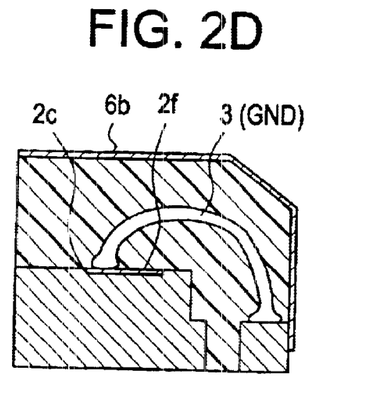
Figure 4A:
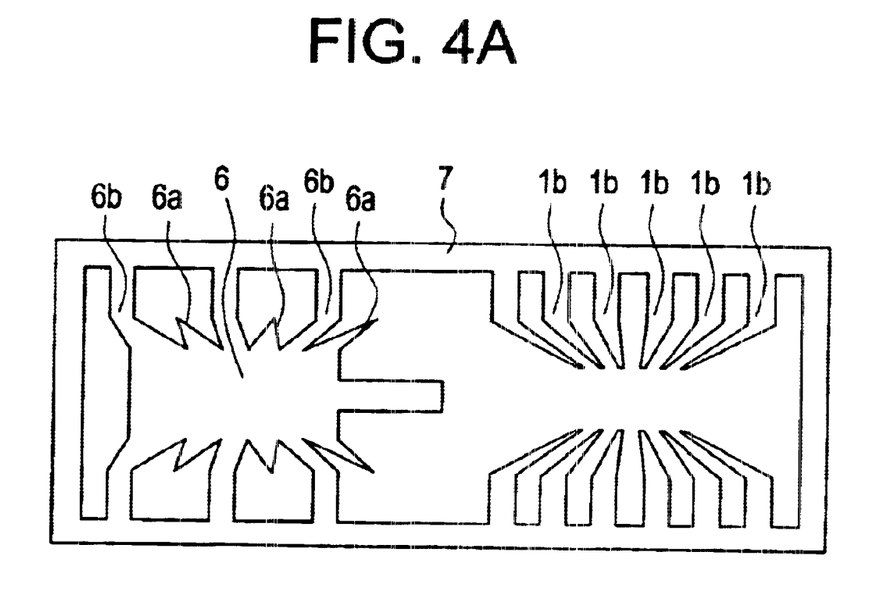
Figure 4B:
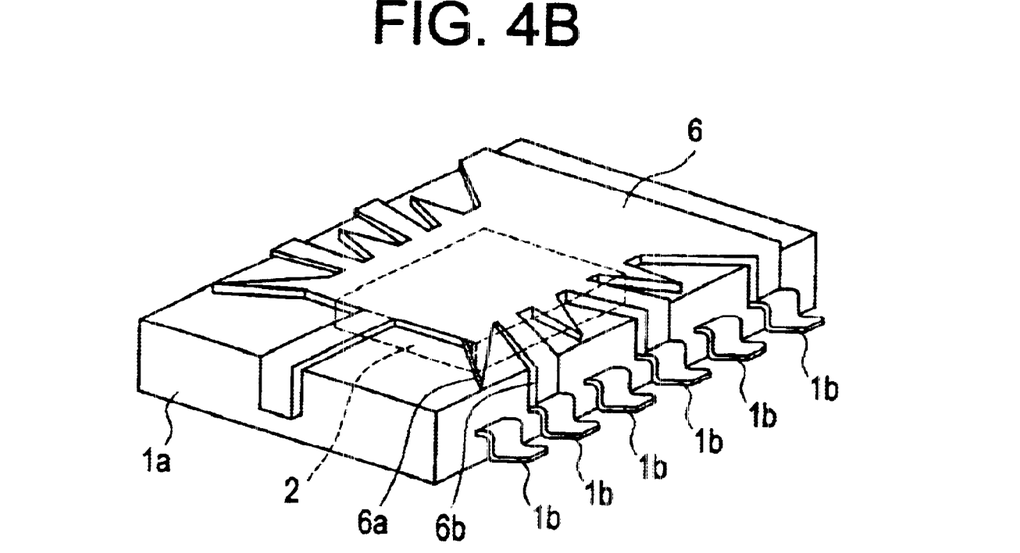
Figure 5A:
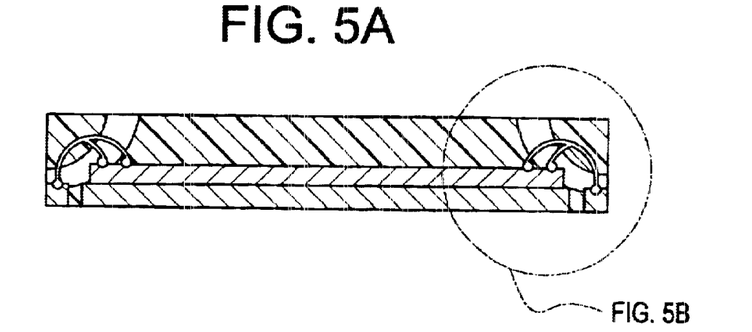
Figure 5B:
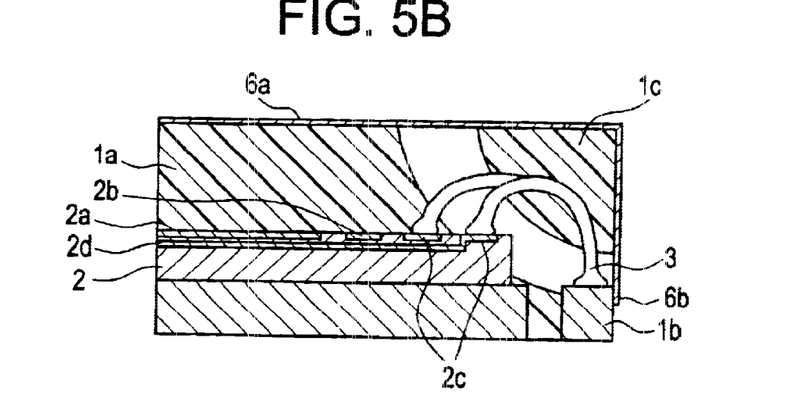
Figures 5C, 5D, 5E:
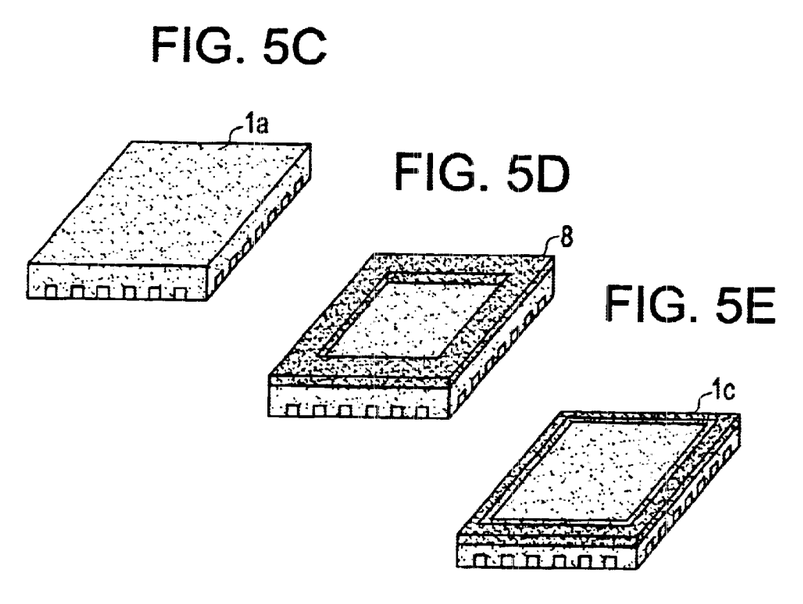
Figure 6A:
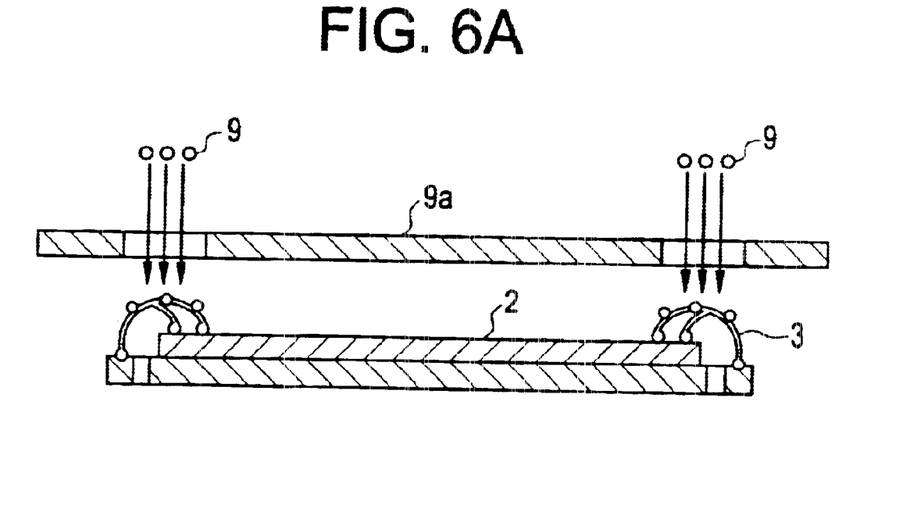
Figure 6B:
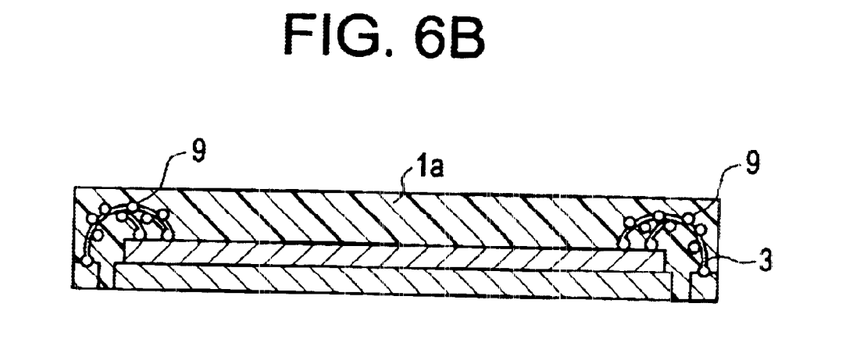
Figure 6C:
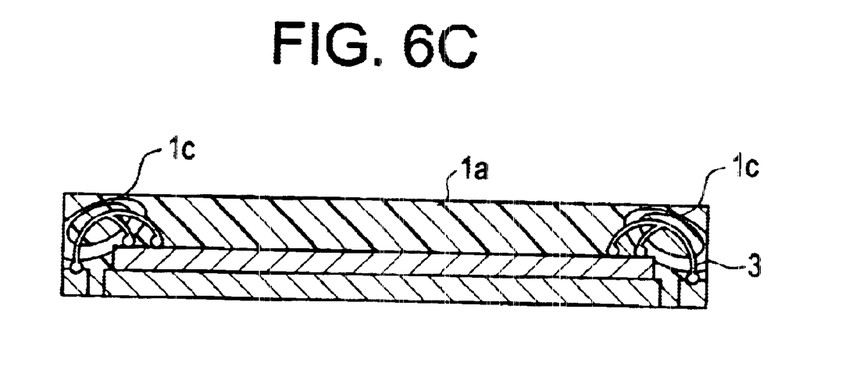

Specific forms for implementing a semiconductor device of the invention, achieved according to respective problem-solving means, are described hereinafter with reference to first to sixth embodiments of the invention. The first embodiment shown in FIG. 1 is an embodiment of first to third problem-solving means. The second embodiment shown in FIG. 2 is an embodiment of the first to fourth problem-solving means while the third embodiment shown in FIG. 3, and the fourth embodiment shown in FIG. 4 are variations of those described. Further, the fifth embodiment shown in FIG. 5 is an embodiment of the, first to fifth problem-solving means, and the sixth embodiment shown in FIG. 6 is a variation thereof. In the figures, parts corresponding to those of the conventional example shown in FIG. 7 are denoted by the same reference numerals, and description centering on points of difference is given hereinafter, omitting duplicated description.

First Embodiment

The specific construction of the first embodiment of the semiconductor device according to the invention is described with reference to the accompanying drawings. FIG. 1 (A) is a partial perspective view of the semiconductor device according to the first embodiment, as seen through a package, to be compared with FIG. 7 showing the conventional semiconductor device. FIG. 1 (B) is a partially enlarged view of a principal part thereof, responsible for the transmission of RF signals. For the purpose of specifying respective usages of elements in the figures, the elements are denoted by signs (Vcc), (Sig), (Sig*), and (GND) indicating use, for power source voltage application, signal transmission, RF signal transmission, and grounding, respectively.

An IC4 (semiconductor device) differs from the previously described IC1 in that RF signals in addition to a multitude of, signals are processed by a signal processing circuit 2a on top of a chip 2, a set of a signal output circuit 2b (Sig*), an signal output line 2d (Sig*), a bonding pad 2c (Sig*), a bonding wire 3 (Sig*), and a terminal 1b (Sig*), sequentially connected with each other for outputting the RF signals, is allocated for the transmission thereof to the outside, and two sets each, consisting of a bonding pad 2c (GND), a bonding wire 3 (GND), and a terminal 1b (GND), also sequentially connected with each other, and disposed on respective sides of the set described so as to be adjacent thereto, are both allocated for grounding.

Further, the IC4 also differs from the IC1 in that a plurality of the bonding pads 2c (GND) are short-circuited via a conductor layer 2e (GND), the bonding pad 2c (Sig*) is provided at a spot deviated from a phantom straight line interconnecting the bonding pads 2c (GND), and a conductor layer (conductor) 2f is extended from the respective bonding pads 2c (GND) or the opposite ends of the conductor layer 2e(GND), so as to be disposed on the opposite sides of the bonding pad 2c (Sig*).

Among those elements, the bonding pad 2c (Sig*), the bonding pads 2c (GND), the conductor layer 2e, and the conductor layers (conductors) 2f are made of the same metal layer, and so forth, as that for other bonding pads 2c (Sig), and a bonding pad 2c (Vcc), and are patterned all together on the same plane where the chip 2 is placed, however, a signal output line 2d is formed by utilizing another patterned wiring layer and so forth, crossing the conductor layer 2e at a different level. Further, the bonding pads 2c (GND) short-circuited with each other and the conductor layer 2e are connected with a ground line 2dd (reference voltage line) of the signal processing circuit 2a, signal output circuits 2b, and so forth, via the same patterned wiring layer, another patterned wiring layer, and so forth, both serving as reference electrodes.

The respective bonding pads 2c (power source electrode, signal electrodes, reference electrodes) are formed in the shape of a square or rectangle with respective sides in the order of 10 to 100 μm, and are juxtaposed at predetermined pitches in the order of 15 to 150 μm. A gold wire of diameter in the order of 10 to 30 μm is in widespread use for the respective bonding wires (thin metal wires) 3, but other metals may be used instead. Most of the terminals (terminals for external connection) 1b are within the predetermined specification of packaging, and made of a metal pin, lead, pad, good conductor rectangular in shape, and so forth:, being juxtaposed at predetermined pitches in the order of 200 to 800 μm.

As shown in the figures, 5 pieces of both the bonding pads 2c and the terminals 1b are juxtaposed at pitches of 90 μm, and 300 μm, respectively, in the X direction, however, among the bonding pads 2c, 2 pieces (GND) thereof, for grounding, are deviated by about 120 μm in the Y direction towards the signal processing circuit 2a. As a result, the bonding pad 2c (Sig*) for RF signals is deviated locally and relatively from an alignment of the 2 pieces of the bonding pads 2c (GND) for grounding, and at the same time, a distance between the bonding pad 2c (Sig*) and each of the bonding pads 2c (GND) is expanded to 150 μm. Incidentally, the number of the bonding pads 2c as well as the terminals 1b is generally in the range of 30 to 300 pieces, however, there is a strong tendency of an increase in the number.

The chip (semiconductor piece) 2 is mostly made from silicon, gallium arsenide, etc., but may be made from other semiconductors. The signal processing circuit 2a, and the signal output circuits (integrated circuits) 2b can be any of a digital circuit, an analog circuit, and a mixed circuit of those, and various types thereof may be formed depending on application, omitting therefore detailed description of the interior thereof. In short, any circuit will suffice if the same is capable of exchanging a plurality of signals with the outside, sending out RF signals among the plurality of the signals to the outside via the signal output line 2d or receiving RF signals from the outside via a similar input line while receiving the reference voltage, such as grounding voltage, and so forth, at the ground line 2dd. Packaging with the plastic mold 1a may be substituted for packaging with ceramic or other material, or these materials may be adopted in combination.

Now, with reference to the IC4 according to the first embodiment, a usage pattern and operation will be described hereinafter.

At the time of assembling/mounting the IC 4 into an application unit, the terminal 1b (Vcc) is connected to a power source line, and so forth, to which the power source voltage is applied, via printed wiring etc. of a printed wiring board on the outside, in which the IC 4 is to be mounted, the terminals (GND) 1b are connected to a grounding line etc., to which the reference voltage is applied, and the terminals 1b (Sig) are connected to respective signal lines etc. for transmission of relevant signals. In particular, the terminal 1b (Sig*), among the terminals 1b (Sig), is connected to a signal line responsible for transmission of the RF signals.

Upon application of a predetermined voltage across the terminal 1b (Vcc) and the terminal 1b (GND), the signal processing circuit 2a and the signal output circuits 2b start operation, whereupon a signal from one of the terminals 1b (Sig) is inputted to the signal processing circuit 2a while a signal generated in the signal processing circuit 2a is delivered from another of the terminals 1b (Sig). A multitude of signals are processed in this way depending on the application purpose of the device, and in this case, if an RF signal is generated by the signal processing circuit 2a, and is delivered from the signal output circuit 2b (Sig*) to the signal output line 2d(Sig*), current for carrying the RF signal flows through the bonding pad 2c (Sig*), the bonding wire 3 (Sig*), and the terminal 1b (Sig*).

This is followed by flow of displacement current and leakage current in the vicinity of a path of the current described above, but most of those currents will flows through the bonding wires 3 (GND) and so forth, adjacent to the bonding pad 2c (Sig*); and so forth, and on both sides thereof. Consequently, there is no or little risk of the bonding wires 3 (Sig) and so forth, for transmission of other signals, being affected by radiation noise etc.

Further, as to a distance between the bonding wire 3 (Sig*) for transmission of RF signals and the respective bonding wires 3 (GND) for grounding, adjacent to the bonding wire 3 (Sig*), and disposed on both sides thereof, the distance on the side of the terminal 1b is wider (300 μm, in the X direction) while that on the side of the bonding pads 2c is narrower than the former, but still larger than that for the conventional case.

That is, a distance between the bonding pad 2c (Sig*) for transmission of RF signals to which the bonding wire 3 (Sig*) is connected, and the bonding pads 2c (GND) for grounding (that is, 150 μm in a diagonal direction on the basis of 90 μm in the X direction, and 120 μm in the Y direction) is wider than a distance (90 μm in the -X direction) between those other bonding pads 2c (Sig), and 2c (Vcc) that remain juxtaposed at the same fundamental pitches as those for the conventional case.

Thus, as a result of expanding the distance on the narrower side wider than before, variation in characteristic impedance, as observed along the bonding wire 3 (Sig*), is rendered milder to that extent, so that occurrence of reflection noises and distortion of signal waveforms will be less. Nevertheless, the fundamental pitches (90 μm in the X direction) at which the bonding pads are juxtaposed are maintained.

Thus, a multitude of common signals (Sig) and RF signals (Sig*) are properly processed by the integrated circuit 2a and 2b formed in the one chip 2. Since the operation pattern of the device varies depending on not only such a specification as described but also an output power, application environments, and so forth, a statement cannot be made without some qualifications, however, even when common signals (Sig) are limited to a frequency at, for example, 500 MHz, that is, 0.5 GHz, or lower, RF signals (Sig*) are permissible up to a frequency at about 3 GHz.

In addition, the IC4 described can be fabricated by substantially the same techniques and process steps as those for the conventional IC1.

Second Embodiment

A second embodiment of a semiconductor device (IC5) according to the invention, with respective elements constructed as shown in FIG. 2, differs from the IC4 according to the first embodiment only in that a conductor layer 6 is additionally provided.

The conductor layer 6 is made of a good conductor in lamellar and plate-like form, similar in size to, or somewhat wider or narrower than a chip 2, and is attached to the top surface of a plastic mold 1a in such a way as to be laminated thereto, but to be parted from the chip 2 and disposed substantially in parallel therewith.

A tapered part 6a (tapered conductor) extends from a spot on the peripheral part of the conductor layer 6, on the side of a terminal 1b (Sig*) for RF signals, creeping over the top surface of the plastic mold 1a towards the terminal 1b (Sig*) while gradually tapering off. The extremity of the tapered part 6a reaches above a bonding wire 3 (Sig*) interconnecting a bonding pad 2c (Sig*) for RF signals and the terminal 1b (Sig*), that is, in the vicinity thereof, but stops short of the terminal 1b (Sig*). Inevitably, the extremity of the tapered part 6a is positioned closer to the bonding wire 3 (Sig*) while the base edge thereof is positioned farther from the bonding wire 3 (Sig*).

Further, line sections 6b are extended from spots on the peripheral part of the conductor layer 6, on both sides of the base edge of the tapered part 6a, towards terminals 1b (GND) for grounding, on both sides of the terminal 1b (Sig*) for RF signals, respectively. Both the line sections 6b reach the terminals 1b (GND), respectively, so that the base edge of the tapered part 6a is connected with bonding pads 2c (GND) indirectly, through the intermediary of the line sections 6b, the terminals 1b (GND), and the bonding wires 3 (GND), respectively.

In this case, factors determining or capable of adjusting the characteristic impedance of a transmission path for RF signals include the bonding wire 3 (Sig*) having uniform inductance distribution due to its constant diameter, the bonding wires 3 (GND) adjacent to the bonding wire 3 (Sig*), and disposed on both sides thereof, capable of adjusting so as to ease a sudden change in capacitance distribution between the bonding wires 3 (GND) and the bonding wire 3 (Sig*) by the effect of a distance therebetween, and in addition, parasitic capacitance distributed between the bonding wire 3 (Sig*) and the tapered part 6a of the conductor layer 6. Furthermore, the tapered part 6a is capable of adjusting capacitance distribution by the effect of not only distance but also variation in shape.

As a result, not only impedance matching can be obtained with greater ease but also matching accuracy is improved, so that in the case of, for example, the specification of the IC 5 being the same as that for the first embodiment except for the conductor layer 6, the maximum permissible frequency of RF signals (Sig*) can be easily increased to the extent of about 5 GHz by reducing the specification of the tapered part 6a.

Third Embodiment

Figure 3A:
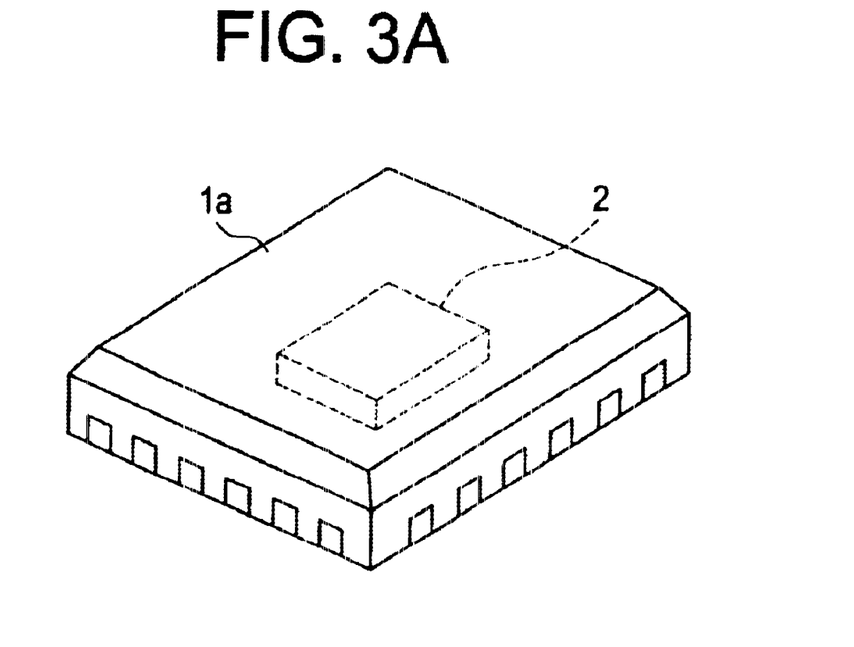
Figure 3B:
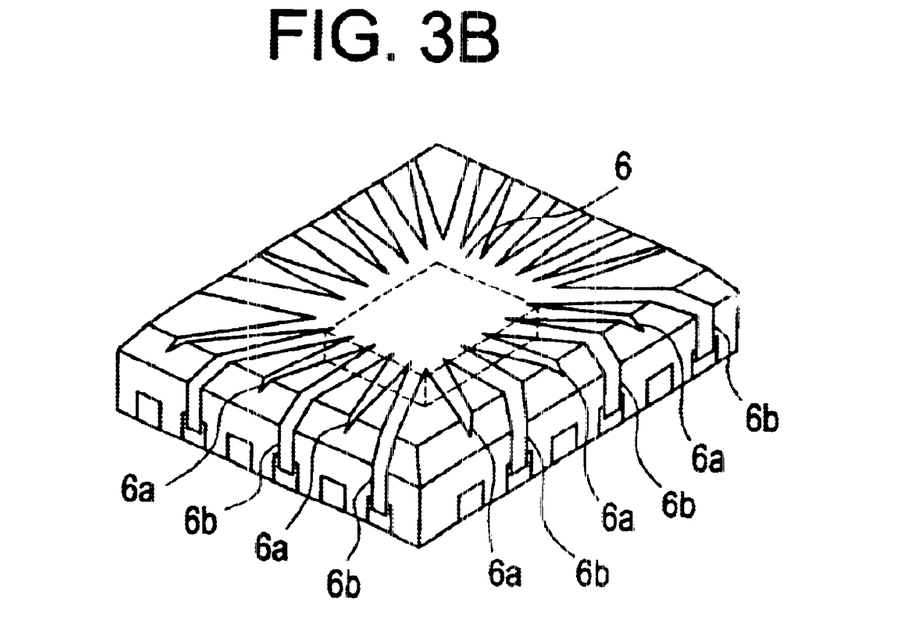

With a third embodiment of a semiconductor device according to the invention, which perspective view is as shown in FIG. 3, the conductor layer 6 according to the second embodiment is formed by printing. Such printing is executed by, for example, applying a conductive paint in a desired pattern.

Shown in the figure is a QFN (Quad Flat Non leaded package). In this case, packaging is executed by the conventional QFN technique and process steps before application of the conductive paint (refer to FIG. 3 (A)), and thereafter, the conductive paint is applied to a package and is cured thereby completing fabrication (refer to FIG. 3 (B)).

As shown in the figure, tapered parts 6a and line sections 6b are alternately disposed, and needless to say, bonding wires 3 (Sig*) (not shown) etc. and bonding wires 3 (GND) (not shown) etc., inside the package, are also alternately allocated so as to correspond to the tapered parts 6a and the line sections 6, respectively, thereby coping with an increase in the number of RF signals to be handled while checking an increase in the number of the bonding wires 3 (GND), terminals 1b (GND), and bonding pads 2c (GND), to be allocated.

Fourth Embodiment

With a fourth embodiment of a semiconductor device according to the invention, which lead frame and perspective view are shown in FIG. 4, the conductor layer 6 according to the second embodiment previously described is formed integrally with a lead frame 7.

In this case, shown in FIG. 4 (B) is an SSOP (Shrink Small Outline Package). The SSOP provided with leads to serve as terminals 1b is fabricated by the steps of preparing the lead frame 7 provided with the leads 1b that are juxtaposed, and formed integrally which a conductor layer 6 having tapered parts 6a and line sections 6b, bonding the leads 1b to bonding pads 2c, respectively, while securely holding those with a plastic mold 1a, subsequently cutting off frame portions, and pasting the conductor layer 6 on the top surface of the plastic mold 1a by bending the same. The semiconductor device according to the fourth embodiment, similar to the IC4, IC5, described in the foregoing, can be completed in this way with ease.

Fifth Embodiment

A fifth embodiment of a semiconductor device according to the invention, which longitudinal section is shown in FIGS. 5(A) and 5 (B), differs from the previously described IC4, IC5, only in that dielectric constant of portions 1c of a plastic mold 1a, on the periphery of bonding wires 3, is variable.

As previously described, the bonding pads 2c and terminals 1b, for use in any of power source voltage application, transmission of signals, transmission of RF signals, and grounding, respectively, are connected with each other via a bonding wire 3, respectively, and the portions 1c, on the periphery of the bonding wires 3, are buried in the plastic mold 1a. A permeable substance for use in adjustment of dielectric constant is contained in the portions 1c, dielectric constant of which varies depending on difference in concentration of the permeable substance.

For the permeable substance, glass fiber, and so forth are suitable to raise dielectric constant while a polyimide, and so forth are suitable to lower dielectric constant, however, since the respective bonding wires 3 extend radially and capacitance tends to come down more as the respective bonding wires 3 extend further towards the outer side, selection is made in most cases such that the further the outer side along the respective bonding wires 3, that is, the further the same proceed from the bonding pad 2c side to the terminal 1b side, the higher dielectric constant becomes in order to compensate such a tendency. Variation in distribution of dielectric constant may be continuous or may occur in stages.

Such permeation of the permeable substance can be implemented by applying (refer to FIG. 5 (D)) a coating agent 8 made from, or containing the permeable substance to the portion 1c, on the periphery of the respective bonding wires 3, after packaging with a plastic mold 1a, and before pasting (refer to FIG. 5 (C)) a conductor layer 6 with tapered parts 6a to the plastic mold 1a, and subsequently, by warming, heating, and so forth as appropriate for permeation and diffusion. Removal of excess of the coating agent 8 thereafter leaves out portions thereof, permeated into the portion 1c of the plastic mold 1a, on the periphery of the respective bonding wires 3 (refer to FIG. 5 (E)), where dielectric constant is stabilized. Variation in the distribution of dielectric constant becomes continuous if the thickness of the coating agent 8 is varied gradually and the variation in the distribution of dielectric constant occurs in stages if the coating agent 8 is applied in multiple-ring fashion.

In this case, in adjusting the characteristic impedance of a transmission path for RF signals, it is possible to make use of not only bonding wires 3 (GND) adjacent to respective bonding wires 3 (Sig*), and disposed on both sides thereof, and tapered conductors 6a, the extremity of which is extended close to the respective bonding wires 3 (Sig*) but also to utilize dielectric constant of the portion 1c of the plastic mold 1a, on the periphery of the respective bonding wires 3. As a result, not only impedance matching can be obtained with greater ease but also matching accuracy is improved, so that even with an IC based on, for example, the first to fourth embodiments described in the foregoing, the maximum permissible frequency of RF signals (Sig*) can be increased to the extent of about 10 GHz.

Sixth Embodiment

With a sixth embodiment of a semiconductor device according to the invention, which longitudinal section is shown in FIGS. 6(A) to 6(B), a substance for adjustment of dielectric constant is caused to be contained in portions 1c of a plastic mold 1a, on the periphery of bonding wires 3, by a different technique.

In this case, an implant agent 9 made from, or containing the substance for adjustment of dielectric constant is first implanted into a spot of respective bonding wires 3 bonded to a chip 2, by, for example, the FIB (Focused Ion Beam) method, and so forth, through the intermediary of a masking 9a (refer to FIG. 6 (A)). Then, packaging with a plastic mold 1a is executed (refer to FIG. 6 (B)), and thereafter, warming, heating, and so forth, as necessary, is applied thereto to thereby diffuse the implant agent 9.

Other Variations

With the respective embodiments described hereinbefore, the signal output circuit 2b and the signal output line 2d are cited as the specific example of the transmission path of RF signals, however, the transmission path of RF signals are not limited thereto, but may be either a signal input circuit and signal input line or a signal input/output circuit and signal input/output line.

Further, the reference voltage is not limited to each grounding (GND), but may suffice if it is at a stable potential against a source voltage, being either digital grounding or analog grounding.

Still further, there is a case where the power source voltage (Vcc) is a negative voltage instead of a positive voltage such as 5V, 3.5V, etc., and there is also a case where different voltages are used via a plurality of the terminals 1b.

The shape of the conductor layer 6 installed on the package is not necessarily limited to those (for example, a star-like shape) shown in the figures. Further, with the respective embodiments described above, the conductor layer 6 is exposed, however, the same may be coated for insulation, and may be buried in the plastic mold 1a if disposed away from the chip 2.

As is evident from the foregoing description, with the semiconductor device according to the first problem solving means, by disposing the transmission path for RF signals so as to be interposed between, or surrounded by paths of the reference voltage at spots of connection by wire bonding, return RF current paths become definite, thereby checking occurrence of radiation noise and reflection noise, so that the invention has an advantageous effect in that there is implemented a semiconductor device capable of properly processing RF signals with the pitches at which the electrodes are juxtaposed remaining narrower than the pitches at which the terminals for external connection are juxtaposed.

Further, with the semiconductor device according to the second problem-solving means, a distance between local electrodes is rendered wider without expanding the fundamental pitches of the electrodes juxtaposed by introducing localized disarray to the alignment of the electrodes, so that variation in impedance at the spots of wire bonding is eased. Hence, the invention gains an advantageous effect of providing a semiconductor device capable of more properly processing RF signals with the pitches at which the electrodes are juxtaposed remaining narrower than the pitches at which the terminals for external connection are juxtaposed.

Still further, with the semiconductor device according to the third problem-solving means, deterioration in capability of the relevant signal electrode being separated from the other signal electrodes due to deviation of the relevant signal electrode from the alignment of the reference electrodes is compensated for by the extensions of the reference electrodes. Hence, the invention has an advantageous effect of providing with ease a semiconductor device capable of more properly processing RF signals with the pitches at which the electrodes are juxtaposed remaining narrower than the pitches at which the terminals for external connection are juxtaposed.

Yet further, with the semiconductor device according to the fourth problem-solving means, a sudden change in parasitic capacitance distributed between the thin metal wires is eased by the agency of the tapered conductor. Hence, the invention has an advantageous effect of providing a semiconductor device capable of more properly processing RF signals with the pitches at which the electrodes are juxtaposed remaining narrower than the pitches at which the terminals for external connection are juxtaposed.

Furthermore, with the semiconductor device according to the fifth problem-solving means, the dielectric constant of the packaging material is rendered adjustable so as to ease variation in impedance at the spots of wire bonding. Hence, the invention has an advantageous effect of providing a semiconductor device capable of more properly processing RF signals with the pitches at which the electrodes are juxtaposed remaining narrower than the pitches at which the terminals for external connection are juxtaposed.

What is claimed is:

1. A semiconductor device comprising a semiconductor piece with an integrated circuit for processing signals, formed therein;

signal electrodes connected with signal lines of the integrated circuit formed in the semiconductor piece, respectively;

a reference electrode connected with a reference voltage line of the integrated circuit formed in the semiconductor piece;

a package encapsulating the semiconductor piece; and terminals for external connection, juxtaposed on the package at pitches wider than a distance between the respective signal electrodes and the reference electrode adjacent thereto, and a plurality of thin metal wires provided within the package, any thereof connecting any of the terminals for external connection to the respective signal electrodes while any other thereof connecting any other of the terminals for external connection to the reference electrode;

wherein the reference electrode is increased in number to plurality, and each of the reference electrodes is disposed on top of the semiconductor piece, and on opposite sides of the respective signal electrodes while short-circuiting the reference electrodes with each other on top of the semiconductor piece.

2. The semiconductor device according to claim 1, wherein the position of the respective signal electrodes is deviated from the alignment of the reference electrodes.

3. The semiconductor device according to claim 2, wherein a conductor layer is extended from the respective reference electrodes or spots where the respective reference electrodes are short-circuited with each other towards both sides of the respective signal electrodes.

4. A semiconductor device according to claim 1 further comprising a tapered conductor provided so as to be disposed away from the semiconductor piece, wherein a base edge of the tapered conductor in indirectly connected with the reference electrode, and an extremity of the tapered conductor is positioned closer to the thin metal wire connected with the signal electrode, among the metal wires.

5. The semiconductor device according to claim 1, wherein a packaging material filling up between the signal electrodes and the terminals for external connections, connected thereto by the thin metal wire, respectively, is variable in dielectric constant continuously or in stages along the direction of the thin metal wire.

6. A semiconductor device according to claim 2, further comprising a tapered conductor provided so as to be disposed away from the semiconductor piece, wherein a base edge of the tapered conductor in indirectly connected with the reference electrode, and an extremity of the tapered conductor is positioned closer to the thin metal wire connected with the signal electrode, among the metal wires.

7. A semiconductor device according to claim 3, further comprising a tapered conductor provided so as to be disposed away from the semiconductor piece, wherein a base edge of the tapered conductor in indirectly connected with the reference electrode, and an extremity of the tapered conductor is positioned closer to the thin metal wire connected with the signal electrode, among the metal wires.

8. The semiconductor device according to claim 2, wherein a packaging material filling up between the signal electrodes and the terminals for external connections, connected thereto by the thin metal wire, respectively, is variable in dielectric constant continuously or in stages along the direction of the thin metal wire.

9. The semiconductor device according to claim 3, wherein a packaging material filling up between the signal electrodes and the terminals for external connections, connected thereto by the thin metal wire, respectively, is variable in dielectric constant continuously or in stages along the direction of the thin metal wire.

10. The semiconductor device according to claim 4, wherein a packaging material filling up between the signal electrodes and the terminals for external connections, connected thereto by the thin metal wire, respectively, is variable in dielectric constant continuously or in stages along the direction of the thin metal wire.

11. The semiconductor device according to claim 6, wherein a packaging material filling up between the signal electrodes and the terminals for external connections, connected thereto by the thin metal wire, respectively, is variable in dielectric constant continuously or in stages along the direction of the thin metal wire.

12. The semiconductor device according to claim 7, wherein a packaging material filling up between the signal electrodes and the terminals for external connections, connected thereto by the thin metal wire, respectively, is variable in dielectric constant continuously or in stages along the direction of the thin metal wire.

* * * * *